United States Patent [19]
Smith et al.

[11] Patent Number: 6,037,806
[45] Date of Patent: Mar. 14, 2000

[54] HIGH SPEED PHASE/FREQUENCY DETECTOR

[75] Inventors: Patrick R. Smith, Garland; Kevin M. Ovens, Plano, both of Tex.

[73] Assignee: Texas Instruments Incorporated, Dallas, Tex.

[21] Appl. No.: 09/049,965

[22] Filed: Mar. 27, 1998

Related U.S. Application Data

[60] Provisional application No. 60/042,190, Mar. 31, 1997.

[51] Int. Cl.[7] .............................. G01R 23/02; H03K 9/06
[52] U.S. Cl. ............................................. 327/47; 327/156
[58] Field of Search .................................... 327/2, 3, 7, 8, 327/12, 39, 40, 41, 43, 47, 49, 147, 148, 155, 156, 157, 159; 331/17, DIG. 2; 375/373, 375, 376

[56] References Cited

U.S. PATENT DOCUMENTS

| | | | |
|---|---|---|---|
| 4,804,928 | 2/1989 | Chloupek et al. | 331/1 A |
| 5,142,555 | 8/1992 | Whiteside | 375/81 |
| 5,483,558 | 1/1996 | Leon et al. | 375/376 |
| 5,592,110 | 1/1997 | Noguchi | 327/12 |
| 5,619,148 | 4/1997 | Guo | 327/3 |
| 5,629,651 | 5/1997 | Mizuno | 331/34 |
| 5,903,195 | 5/1999 | Lukes et al. | 331/4 |

*Primary Examiner*—My-Trang Nu Ton
*Attorney, Agent, or Firm*—Robby T. Holland; Carlton H. Hoel; Richard L. Donaldson

[57] ABSTRACT

A phase/frequency detector (18) includes a first memory circuit (50), a second memory circuit (52), a first set circuit (54), a second set circuit (58) and a reset circuit (56). The first memory circuit (50) provides a first output signal (20) in response to the first input signal (12). The second memory circuit (52) provides a second output signal (22) in response to the second input signal (14). The first set circuit (54) initiates the transition of the first memory circuit (50) to the active state, and the second set circuit (58) initiates the transition of the second memory circuit (52) to the active state. The reset circuit (56) initiates the transition of the memory circuits (50, 52) to the inactive state.

5 Claims, 3 Drawing Sheets

HIGH SPEED PHASE/FREQUENCY DETECTOR

This is a Non Provisional application filed under 35 USC 119(e) and claims priority of prior provisional, Ser. No. 60/042,190 of inventor Ovens, et al., filed Mar. 31, 1997.

TECHNICAL FIELD OF THE INVENTION

This invention relates in general to the field of phase lock loops and more specifically to a high speed phase/frequency detector.

BACKGROUND OF THE INVENTION

The phase lock loop is commonly used in digital circuitry to synchronize clock signals. Its application includes, for example, anything requiring clock synchronization or clock synthesis, such as radar applications and telecommunications. Continuing advances in technology have resulted in an increase in the operating speed of electrical devices. Unfortunately, the speed of phase/frequency detectors ("PFDs") in the phase lock loop has not increased at a pace sufficient to keep up with technology.

Current PFDs incorporate multiple logic devices that cause significant logic delays and limit the PFD's maximum operating frequency. If the PFD's maximum operating frequency is less than that of the voltage controlled oscillator ("VCO"), the phase lock loop may fail to function properly. For example, it may enter a condition known as VCO runaway.

One technique to incorporate a frequency limited PFD is to add additional hardware logic and/or software to detect and correct such failure situations. This increases costs and may limit performance.

Another technique to incorporate frequency limited PFD's in higher frequency circuitry reduces the clock signal frequency prior to presentation to the PFD. This results in increased overhead due to additional elements placed in the phase lock loop, and introduces more error sources and potential for device failure.

SUMMARY OF THE INVENTION

Accordingly, a need has arisen for a high speed PFD that operates in high speed circuitry without the need of additional frequency modification or failure detection and correction circuitry. According to the teachings of the present invention, a PFD is provided that addresses the disadvantages and problems associated with previously used PFD's.

A PFD circuit includes a first memory circuit that generates a first output signal in response to a first input signal and a second memory circuit that generates a second output signal in response to a second input signal. Each of the first memory circuit and the second memory circuit includes a first cross-coupled transistor pair that is coupled to a first reference potential and a second cross-coupled transistor pair that is coupled to the first cross-coupled transistor pair and a second reference potential. A first set circuit is coupled to the first memory circuit and is operable to transition the first memory circuit to a first state. A second set circuit is coupled to the second memory circuit and is operable to transition the second memory circuit to the first state. A reset circuit is coupled to each of the first memory circuit and the second memory circuit and is operable to transition the first memory circuit and the second memory circuit to a second state.

A technical advantage of the present invention is the ability of the PFD to operate in high speed circuitry without additional frequency modification circuitry or failure detection and correction circuitry. Another technical advantage is that flexible design characteristics provide for increased reliability and enhanced operation. Also, the present invention operates on a single clock edge, such as the rising clock edge, to enable phase/frequency detection of signals with different duty cycles. Other technical advantages are apparent to one skilled in the art in view of the attached description, drawings, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1:
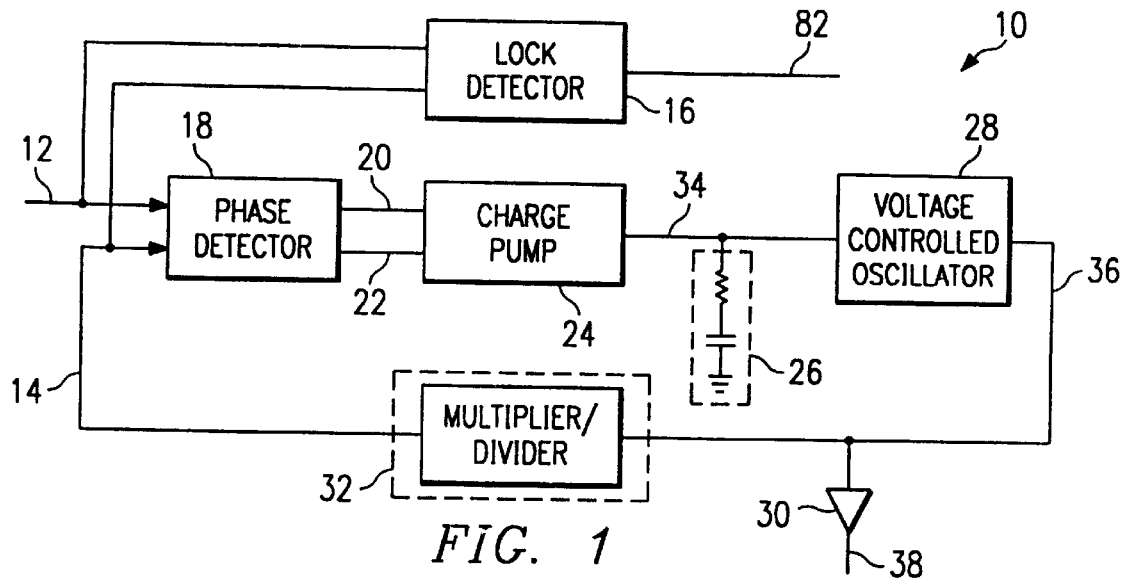
FIG. 1 is a schematic diagram of a phase lock loop having a phase/frequency detector according to the present invention.

FIG. 1 illustrates a phase lock loop 10 that includes a first input signal 12 and a second input signal 14. In one embodiment, first input signal 12 is a reference clock, and second input signal 14 is a feedback input clock. In general, a phase/frequency detector ("PFD") 18 detects the phase and/or frequency difference between input signals 12 and 14. PFD 18 operates at high frequencies, such as frequencies greater than one gigahertz.

Phase lock loop 10 also includes a lock detector 16 coupled to input signals 12 and 14. PFD 18 is coupled to a charge pump 24 by a first output signal 20 and a second output signal 22. Although a number of implementations can be appreciated by one skilled in the art, charge pump 24 may include a pull-up device and a pull-down device coupled to signals 20 and 22, respectively, that can increase or decrease the voltage output to a voltage controlled oscillator 28. Generally, charge pump 24 translates the relative time that signals 20 and 22 are asserted into a corresponding voltage.

Charge pump 24 is coupled to voltage controlled oscillator 28 over a line having an optional filtering circuit 26. Voltage controlled oscillator 28 is coupled to an optional clock buffer 30 and an optional multiplier/divider 32. The output of multiplier/divider 32 is fed into PFD 18 and lock detector 16 as second input signal 14.

In operation, PFD 18 detects the phase or frequency difference, if any, between input signals 12 and 14. PFD 18 provides first output signal 20 and second output signal 22 to charge pump 24, which in turn supplies a control signal 34 to voltage controlled oscillator 28 to adjust the phase or frequency of an oscillator output 36. In this manner, voltage controlled oscillator 28 provides a correction to second input signal 14 to remove any phase or frequency difference between input signals 12 and 14. When only first output signal 20 is active, control signal 34 drives voltage controlled oscillator 28 to increase the frequency of second input signal 14 to remove the phase or frequency difference between signals 12 and 14. On the other hand, when only second output signal 22 is active, control signal 34 drives voltage controlled oscillator 28 to decrease the frequency of second input signal 14 to remove the phase or frequency difference between signals 12 and 14. Finally, when both output signals 20 and 22 are active, control signal 34 drives voltage controlled oscillator 28 to both increase and decrease the frequency of second output signal 14. This offsetting information drives pull-up and pull-down devices associated with charge pump 24, which then maintains the current phase/frequency state of second input signal 14. This "blocking" provides stability advantages as compared to taking no action when input signals 12 and 14 are in-phase.

Lock detector 16 determines whether input signals 12 and 14 are in-phase (locked) or out-of-phase (not locked), and may provide a visible indication of the condition to a user. Filtering circuit 26 may alter the condition of control signal 34 in frequency, amplitude, or other characteristic for proper presentation to voltage controlled oscillator 28. Oscillator output 36 may then be buffered by clock buffer 30, and provided as a clock signal 38 for use in other circuitry.

In one embodiment, PFD 18 may have a maximum operating frequency that is less than the frequency of clock signal 38. In such a case, multiplier/divider 32 divides oscillator output 36 before presentation to PFD 18. However, the present invention enables PFD 18 to operate at frequencies greater than voltage controlled oscillator 28, which may eliminate the need for multiplier/divider 32 while providing faster and more reliable operation.

Figure 2:
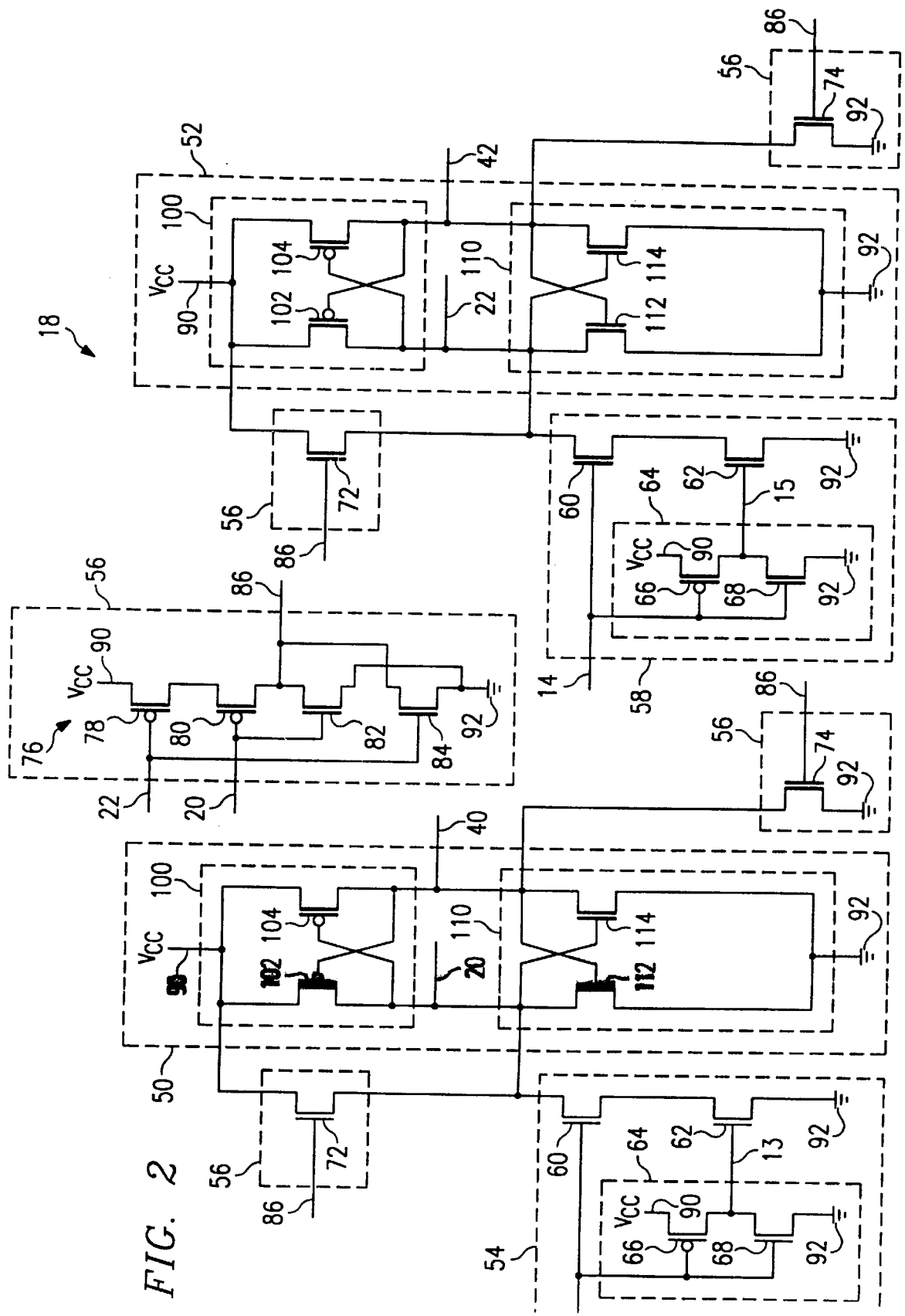
FIG. 2 is a detailed circuit diagram of the phase/frequency detector.

FIG. 2 illustrates a detailed circuit diagram of PFD 18. PFD 18 includes a first memory circuit 50 and a second memory circuit 52. A first set circuit 54 and portions of a reset circuit 56 are coupled to first memory circuit 50. Similarly, a second set circuit 58 and portions of reset circuit 56 are coupled to second memory circuit 52. Both first memory circuit 50 and second memory circuit 52 are coupled to a NOR gate 76, which is part of reset circuit 56.

Each of memory circuits 50 and 52 receives one of input signals 12 and 14. For example, first memory circuit 50 receives first input signal 12 through first set circuit 54. First input signal 12 is thereby also associated with the portions of reset circuit 56 that are coupled to first memory circuit 50. Likewise, second memory circuit 52 receives second input signal 14 through second set circuit 58 associated with second memory circuit 52. Second input signal 14 is thereby also associated with the portions of reset circuit 56 that are coupled to second memory circuit 52. Other than receiving different input signals, the circuitry associated with first memory circuit 50 and second memory circuit 52 are substantially similar in the embodiment shown in FIG. 2.

The following is a description of the circuitry and functions associated with first memory circuit 50 and first input signal 12. Second memory circuit 52 and second input signal 14 include similar circuitry and functions.

Set circuit 54 includes a first set n-channel metal-oxide-semiconductor field effect transistor (NMOSFET) 60 and a second set NMOSFET 62. The gate of first set NMOSFET 60 and an inverter circuit 64 receive first input signal 12. The output of inverter circuit 64 provides an inverse first input signal 13 to the gate of second set NMOSFET 62. Set NMOSFETs 60 and 62 connect in series, such that the source of first set NMOSFET 60 is coupled to the drain of second set NMOSFET 62. The source of second set NMOSFET 62 is coupled to a second reference potential 92, which may be ground.

Inverter circuit 64 includes an inverter p-channel metal-oxide-semiconductor field effect transistor (PMOSFET) 66 and an inverter NMOSFET 68, coupled to form a complimentary metal-oxide-semiconductor (CMOS) inverter. The gate of inverter PMOSFET 66 and the gate of inverter NMOSFET 68 receive first input signal 12. The source of inverter PMOSFET 66 is coupled to a first reference potential 90, generally referred to as $V_{cc}$. The drain of inverter PMOSFET 66 is coupled to the drain of inverter NMOSFET 68, and the source of inverter NMOSFET 68 is coupled to second reference potential 92. The drains of inverter MOSFETs 66 and 68 are coupled to the gate of second set NMOSFET 62. It is understood that inverter circuit 64 may comprise implementations other than the CMOS inverter implementation shown. In a similar manner, second input signal 14 is provided to a second set circuit 58. Second set circuit 58 includes another inverter circuit 64 that provides an inverse second input signal 15.

First memory circuit 50 comprises a first cross-coupled transistor pair 100 that includes a first PMOSFET 102 and a second PMOSFET 104. PMOSFETs 102 and 104 have sources coupled to first reference potential 90 and cross-coupled drain-to-gate connections. The drain of first PMOSFET 102 and the gate of second PMOSFET 104 are also coupled to the drain of first set NMOSFET 60.

First memory circuit 50 further includes a second cross-coupled transistor pair 110 that includes a first NMOSFET 112 and a second NMOSFET 114. NMOSFET's 112 and 114 have sources coupled to second reference potential 92 and cross-coupled drain-to-gate connections. The drain of first NMOSFET 112 and the gate of second NMOSFET 114 are also coupled to the drain of first set NMOSFET 60. The gate of first NMOSFET 112 and the drain of second NMOSFET 114 are coupled to the gate of first PMOSFET 102 and the drain of second PMOSFET 104. In this manner, cross-coupled transistor pairs 100 and 110 may combine to form a four-transistor SRAM cell. The drain of first NMOSFET 112 provides first output signal 20. The drain of second NMOSFET 114 provides an inverse first output signal 40.

Second memory circuit 52 comprises a similar construction, but receives second input signal 14. Accordingly, second memory circuit 52 provides second output signal 22 at the drain of first NMOSFET 112 and an inverse second output signal 42 at the drain of second NMOSFET 114.

Reset circuit 56 comprises NOR gate 76, a first reset NMOSFET 72, and a second reset NMOSFET 74. NOR gate 76 as shown comprises a CMOS NOR gate implementation that includes a first NOR PMOSFET 78 with a source coupled to first reference potential 90 and a drain coupled to the source of a second NOR PMOSFET 80. The drain of second NOR PMOSFET 80 is coupled to the drain of a first NOR NMOSFET 82. The source of first NOR NMOSFET 82 and source of a second NOR NMOSFET 84 are coupled to second reference potential 92. The drain of second NOR NMOSFET 84 is coupled to the drain of first NOR NMOSFET 82.

First output signal 20 is provided to the gate of second NOR PMOSFET 80 and the gate of the first NOR NMOSFET 82. Second output signal 22 is provided to the gate of first NOR PMOSFET 78 and the gate of second NOR NMOSFET 84. The drain of first NOR NMOSFET 82 provides the output of NOR gate 76, a reset signal 86. Reset signal 86 is coupled to the gate of first reset NMOSFET 72 and the gate of second reset NMOSFET 74. It is understood that NOR gate 76 may comprise implementations other than the CMOS NOR gate implementation shown.

First reset NMOSFET 72 has a drain coupled to first reference potential 90 and a source coupled to the drain of first NMOSFET 112. Second reset NMOSFET 74 has a drain coupled to the drain of second NMOSFET 114 and a source coupled to second reference potential 92. Reset NMOSFETs 72 and 74 may be found in both first memory circuit 50 and second memory circuit 52.

In operation, memory circuits 50 and 52 transition between an active state and an inactive state based on the status of input signals 12 and 14 and reset signal 86. For example, first memory circuit 50 transitions to the active state for each clock pulse of first input signal 12. Similarly, second memory circuit 52 transitions to the active state for each clock pulse of second input signal 14. Once the rising edges of both signals 12 and 14 have been detected, both memory circuits So and 52 return to the inactive state. Thus, both memory circuits 50 and 52 transition to the active state and back to the inactive state (they are "set" and "reset") for each set of clock pulses of input signals 12 and 14. The time between the detection of the rising edges of input signals 12 and 14 is proportional to the phase or frequency difference between them. Accordingly, PFD 18 detects the phase or frequency difference between input signals 12 and 14, and provides this information to other elements of phase lock loop 10, such as charge pump 24 and/or voltage controlled oscillator 28.

Like the structural implementation, the general operation of first memory circuit 50, first set circuit 54 and reset circuit 56 is substantially similar to that of second memory circuit 52, second set circuit 58, and reset circuit 56. As such, the detailed operational discussion is simplified by focusing on the operation of first memory circuit 50, though it is understood that second memory circuit 52 operates in a similar manner.

First memory circuit 50 transitions between an active state and an inactive state based on status of first input signal 12 and reset signal 86. First memory circuit 50 operates in its active state when first output signal 20 is low (and inverse first output signal 40 is high), and in its inactive state when first output signal 20 is high (and inverse first output signal 40 is low). Accordingly, output signals 20 and 22 are "active low" signals. Operation in the active state indicates that the rising edge of first input signal 12 has been detected. It is understood that PFD 18 could be designed to transition based on the condition of inverse first output signal 40 and inverse second output signal 42, rather than the current implementation using output signals 20 and 22. second memory circuit 52 operates in a similar manner with respect to second input signal 14.

The MOSFET transistors of PFD 18 operate as switches that are activated or deactivated according to the status of their gate inputs. An active MOSFET has a closed drain-to-source (NMOSFET) or source-to-drain (PMOSFET) connection. An inactive MOSFET has an open drain-to-source (NMOSPET) or source-to-drain (PMOSFET) connection. An NMOSFET is active when the gate input is high and inactive when the gate input is low, while a PMOSFET is active when the gate input is low, and inactive when the gate input is high.

Set circuit 54 triggers the transition of first memory circuit 50 from the inactive state to the active state. Set circuit 54 initiates this transition when a rising edge occurs on first input signal 12. Prior to its rising edge, first input signal 12 is low and inverse first input signal 13 is high. Accordingly, first set NMOSFET 60 is inactive and second set NMOSFET 62 is active. At its rising edge, first input signal 12 goes high and activates first set NMOSFET 60. Second Set NMOSFET 62 remains active momentarily due to the transition time of inverter circuit 64. In the CMOS inverter implementation shown, the delay time of inverter circuit 64 corresponds to the transition time of inverter MOSFETs 66 and 68. During this time, set NMOSFETs 60 and 62 are simultaneously active, providing second reference potential 92 to the gate of second PMOSFET 104, activating it, and to the gate of second NMOSFET 114, deactivating it. Activating second PMOSFET 104 provides first reference potential 90 to the gate of first PMOSFET 102, deactivating it, and to the gate of first NMOSFET 112, activating it.

As soon as inverse first input signal 13 goes low, second set NMOSFET 62 is deactivated, removing the connection to second reference potential 92. The brief connection to second reference potential 92 provided by the simultaneous activation of set NMOSFETs 60 and 62, however, is sufficient to trigger the transition of first memory circuit 50 to the active state. Once the transition is triggered, first NMOSFET 112 provides second reference potential 92 to the gate of second PMOSFET 104 (replacing the connection provided by set circuit 54). First cross-coupled transistor pair 100 and second cross-coupled transistor pair 110 now operate together to maintain continuous activation of second PMOSFET 104 and first NMOSFET 112, and continuous inactivation of first PMOSFET 102 and second NMOSFET 114. Thus, first memory circuit 50 stays in the active state without the connection to second reference potential 92 provided by set circuit 54.

In a similar manner, second set circuit 58 triggers the transition of second memory circuit 52 from the inactive state to the active state when a rising edge occurs on second input signal 14.

Reset circuit 56 triggers the transition of both memory circuits 50 and 52 from the active state to the inactive state based on the status of output signals 20 and 22. Reset circuit 56 initiates this transition when the rising edges of both input signals 12 and 14 have been detected. When this occurs, first output signal 20 and second output signal 22 are both low, activating NOR PMOSFETs 78 and 80, and deactivating NOR NMOSFETs 82 and 84. This state of gate activations causes reset signal 86 to go high at the value of first reference potential 90. Reset signal 86 then activates first reset NMOSFET 72 and second reset NMOSFET 74. Activating NMOSFET 72 provides first reference potential 90 to the gate of second PMOSFET 104, deactivating it, and the gate of second NMOSFET 114, activating it. Activating NMOSFET 74 (or second NMOSFET 114) provides second reference potential 92 to the gate of first PMOSFET 102, activating it, and to the gate of first NMOSFET 112, deactivating it. This occurs in both memory circuits 50 and 52.

Similar to the discussion above with respect to the triggering ability of set circuit 54, the brief connection to first reference potential 90 provided by the activation of first reset NMOSFET 72, and the brief connection to second reference potential 92 provided by the activation of second reset NMOSFET 74, are sufficient to trigger the transition of memory circuits 50 and 52 to the inactive state. First cross-coupled transistor pair 100 and second cross-coupled transistor pair 110 now operate together to maintain continuous activation of first PMOSFET 102 and second NMOSFET 114, and continuous inactivation of second PMOSFET 104 and first NMOSFET 112. Thus, memory circuits 50 and 52 remain in the inactive state without the connection to reference potentials 90 and 92 provided by reset circuit 56. Since memory circuits 50 and 52 transition to the inactive state, output signals 20 and 22 transition high, which deactivates NOR PMOSFETs 78 and 80 and activates NOR NMOSFETs 82 and 84, causing reset signal 86 to go low. PFD 18 is now ready to detect the rising edges of the next set of clock pulses of input signals 12 and 14.

It is understood that reset circuit 56 may not require both first reset NMOSFET 72 and second reset NMOSFET 74 in order to initiate the transition of memory circuits 50 and 52 to the inactive state, depending on the electrical characteristics of components in PFD 18. In a manner similar to the triggering effect of set circuit 54, the triggering effect of reset circuit 56 may be performed by either first reset NMOSFET 72 or second reset NMOSFET 74 due to the cross-coupled structure of cross-coupled transistor pairs 100 and 110. However, in a particular embodiment, including both first reset NMOSFET 72 and second reset NMOSFET 74 in PFD 18 may provide enhanced performance and reliability. Similarly, a set circuit (not shown) similar in design to set circuits 54 or 58 may couple to first reference potential 90 and the drain of second PMOSFET 104 to enhance the performance and reliability of PFD 18. It is understood that the composition of set circuits 54 and 58 and reset circuit 56 can be designed in order to provide desirable timing and redundancy characteristics of PFD 18.

Figure 3:
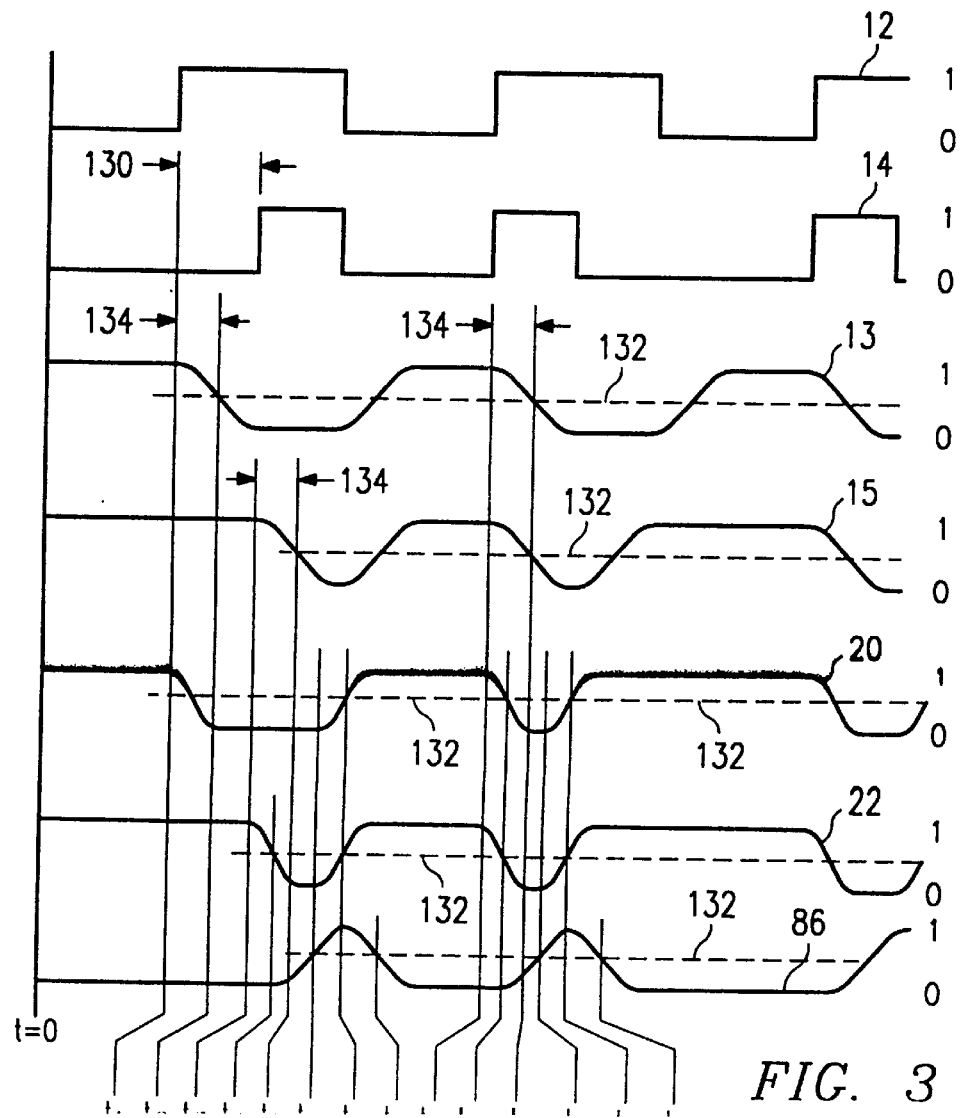
FIG. 3 is a timing diagram depicting the operational characteristics of the phase/frequency detector.

FIG. 3 is a timing diagram illustrating the operational characteristics of PFD 18. FIG. 3 shows the digital statue (high or low) of first input signal 12, second input signal 14, inverse first input signal 13, inverse second input signal 15, first output signal 20, second output signal 22, and reset signal 86. The sloped transitions of signals 13, 15, 20, 22 and 86 indicate that the MOSFETS of PFD 18 have inherent dynamic or transitional response times. The particular dynamics indicated in FIG. 3 are not necessarily representative of the actual transitional response times of signals 13, 15, 20, 22 and 86 or true dynamics of memory circuits 50 and 52. Further, it is not necessary that the rising and falling dynamic of a signal be the same. It is understood that signals 12 and 14 may also have dynamic responses. Also, signals 12 and 14 have different duty cycles, but PFD 18 operates on the rising edge so that any perceived phase or frequency difference on the falling edge is ignored. The present invention, however, contemplates operation on either the rising or falling clock edge of signals 12 and 14.

For the first clock pulses illustrated in FIG. 3, input signals 12 and 14 differ in phase by a phase difference 130 as measured on the rising edge. A threshold 132 represents the point above which the voltage of signals 13, 15, 20, 22 and 86 is considered a logic high. The rising edge of first input signal 12 occurs at time $t_1$, and inverse first input signal 13 begins to transition low. Until inverse first input signal 13 reaches threshold 132 at time $t_2$, set NMOSFETs 60 and 62 are simultaneously activated. A delay time 134 represents the transition delay of inverter circuit 64. Since at time $t_1$ set NMOSFETs 60 and 62 are both active, first memory circuit 50 begins its transition to the active state, which is indicated by first output signal 20 beginning its transition low at time $t_1$. When first output signal 20 reaches threshold 132, first memory circuit 50 has transitioned to the active state and the rising edge of first input signal 12 has been detected. First memory circuit 50 will now operate in the active state, with first output signal 20 remaining low, until second memory circuit 52 detects the rising edge of second input signal 14.

Inverse first input signal 13 reaches threshold 132 at time $t_2$. At this time, set NMOSFETs 60 and 62 are no longer simultaneously activated. However, as long as first output signal 20 has already reached threshold 132, first memory circuit 50 will operate in its first state in the manner described above with respect to FIG. 2. Accordingly, a proper setting of delay time 134 of inverter circuit 64 is important to the operation of PFD 18. If inverter circuit 64 is too fast, first output signal 20 may not reach threshold 132 before inverse first input signal 13 reaches threshold 132, thereby preventing the triggering connection to second reference potential 92 provided by set circuit 54. On the other hand, though PFD 18 will still work, a slow responding inverter circuit 64 may limit the maximum operating frequency of PFD 18.

Second memory circuit 52 operates in a similar manner with respect to second input signal 14. The rising edge of second input signal 14 occurs at time $t_3$, and inverse second input signal 15 begins to transition low. Second output signal 32 also begins to transition low as a result of the simultaneous activation of set NMOSFETs 60 and 62. Similar to the operation of first memory circuit 50 above, second output signal 22 must drop to threshold 132 prior to time $t_5$, when inverse second input signal goes low. When second output signal 22 reaches threshold 132 at time $t_4$, second memory circuit 52 has been set to the active state and the rising edge of second input signal 14 has been detected. Time $t_4$ indicates the instant at which output signals 20 and 22 first become simultaneously low, thereby initiating the transition of reset signal 86 from low to high. At time $t_6$, reset signal 86 reaches threshold 132 and is considered high. This activates reset NMOSFETs 72 and 74 of both memory circuits 50 and 52 causing memory circuits 50 and 52 to transition back to the inactive state. Accordingly, output signals 20 and 22 begin to transition high at time $t_6$.

At time $t_7$, output signals 20 and 22 reach threshold 132, the NOR condition at NOR gate 76 is removed, and reset signal 86 begins to transition low. When reset signal 86 reaches threshold 132 at time $t_8$, PFD 18 is reset and ready to receive the next set of clock pulses on input signals 12 and 14. The relative time that output signal 20 is active as compared to output signal 22 causes charge pump 24 to increase the value of control signal 34 to voltage controlled oscillator 28. This, in turn, causes an increase in the frequency of signal 14 to reduce phase difference 130.

For the second clock pulses illustrated in FIG. 3, input signals 12 and 14 are aligned in phase as measured on the rising edge. Inverse first input signal 13 and inverse second input signal 15 begin to transition low at time $t_9$ and pass threshold 132 at time $t_{11}$. The time for signals 13 and 15 to transition from time $t_9$ to time $t_{11}$ represents delay time 134 of inverter circuit 64. Within this delay time 134, signals 20 and 22 transition below threshold 132 at time $t_{10}$. When both signals 20 and 22 reach threshold 132 at time $t_{10}$, reset signal 86 begins to transition high. Upon reset signal 86 reaching threshold 132 at time $t_{12}$, signals 20 and 22, and thus memory circuits 50 and 52, begin to transition to the inactive state. Upon signals 20 and 22 reaching threshold 132 at time $t_{13}$, the NOR condition at NOR gate 76 is removed and reset signal 86 begins to transition low. When reset signal 86 reaches threshold 132 at time $t_{14}$, PFD 18 is reset and ready to receive the next set of clock pulses on input signals 12 and 14. In this phase-aligned case, the relative time that output signals 20 and 22 are active is nearly identical causing little, if any, change to the value of control signal 34 generated by charge pump 24.

PFD 18 is operable at high speeds due to the small number of gate delays encountered during a set and reset in response to a set of clock pulses on input signals 12 and 14. In one embodiment, PFD 18 has four MOSFET transition delays: the setting of the memory circuit associated with the second detected input signal (time $t_3$ to time $t_4$), the transition high of reset signal 86 (time $t_4$ to time $t_6$), the reset delay of output signals 20 and 22 (time $t_6$ to time $t_7$) and the transition low of reset signal 86 (time $t_7$ to time $t_8$). By comparison, a typical voltage controlled oscillator 28 may have a minimum of six gate delays during its response to a set of clock pulses on input signals 12 and 14. The reduced number of gate delays in this embodiment of the present invention reduces the problems associated with VCO runaway.

Figure 4:
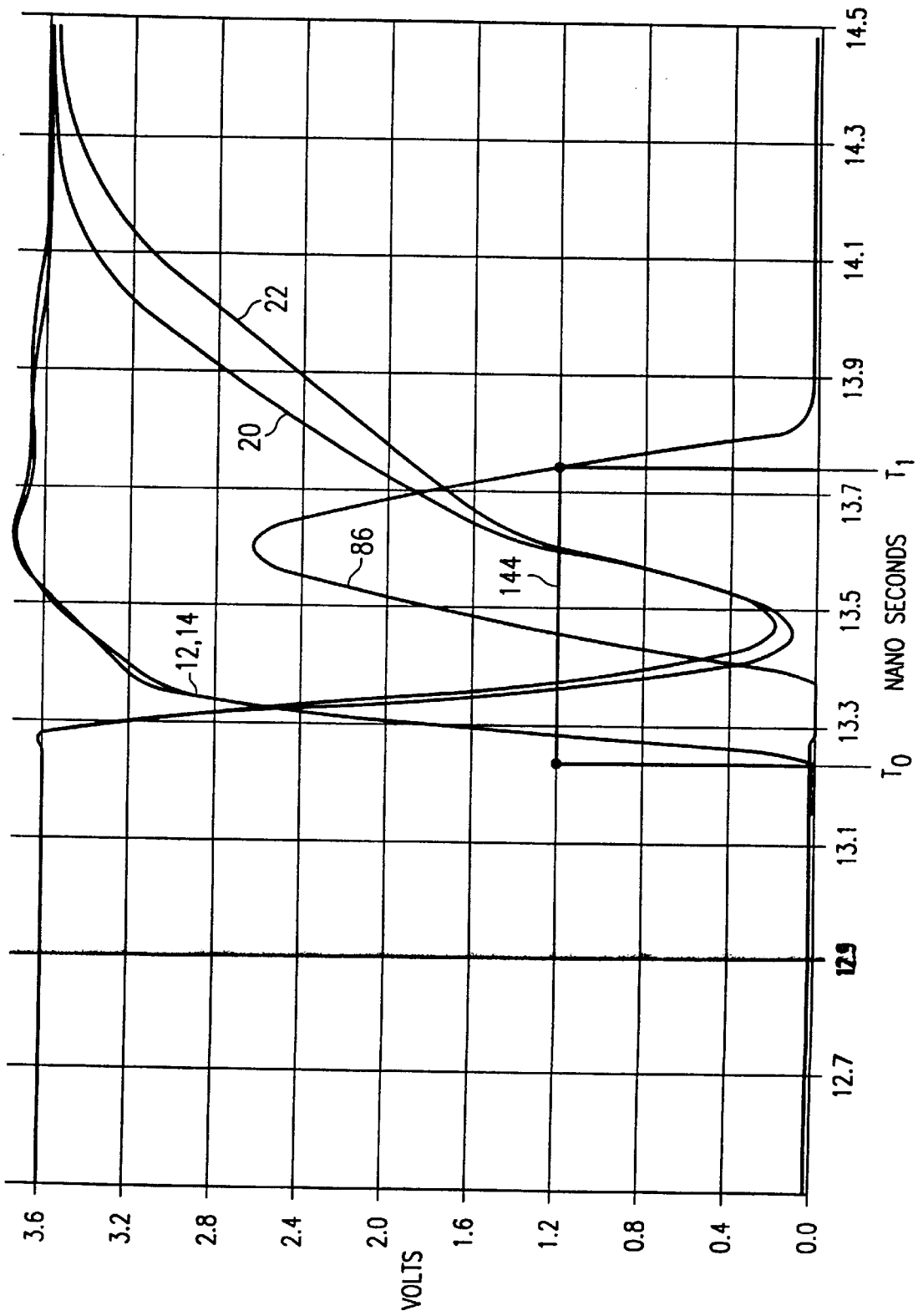
FIG. 4 is a graph illustrating the operational timing characteristics of the phase/frequency detector of the present invention under an example test condition.

FIG. 4 illustrates the operational timing characteristics of PFD 18 under a test condition. In the test case shown, the phase difference between input signals 12 and 14 is zero. The zero phase difference test case allows for a simple illustration of the speed potential of PFD 18. One cycle of the operation of PFD 18 includes setting both memory circuits 50 and 52 at the rising edges of input signals 12 and 14, respectively, and resetting both memory circuits 50 and 52 when the rising edge of the lagging signal is detected. Accordingly, the speed potential of PFD 18 is dependent on the time between the rising edge of the first of input signals 12 and 14 and the reset of both memory circuits 50 and 52.

A signal is often considered logic high at approximately 1.2 volts. It is understood, however, that this may fluctuate from device to device or element to element, as certain MOSFETs may have different threshold voltages. Initially, output signals 20 and 22 are high, indicating that the rising edges of signals 12 and 14 have not occurred. As soon as the rising edge of signals 12 and 14 occurs, output signals 20 and 22 begin to transition low, indicating that memory circuits 50 and 52 have detected the rising edges of signals 12 and 14, respectively, and are transitioning to the active state. When output signals 20 and 22 reach approximately 1.2 volts, reset signal 86 begins to transition high, indicating that NOR gate 76 of reset circuit 56 is ready to generate a high output in response to the NOR condition of output signals 20 and 22. Reset signal 86 continues to transition high, resetting memory circuits 50 and 52 when it reaches approximately 1.2 volts and causing output signals 20 and 22 to go high. When output signals 20 and 22 reach threshold 132, the NOR condition of output signals 20 and 22 is removed, and reset signal 86 peaks and begins to return low. When reset signal 86 reaches approximately 1.2 volts, PFD 18 is ready to accept another set of clock pulses on input signals 12 and 14.

A cycle time 144 for PFD 18 is drawn at the approximate voltage of threshold 132. Cycle time 144 is representative of the time required for PFD 18 to detect and react to a set of clock pulses provided to PFD 18. The rising edge of signals 12 and 14 begins at time $T_0$. Reset signal 86 passes below 1.2 volts at time $T_1$. An estimate of the time between $T_0$ and $T_1$ is approximately 0.5 nanoseconds. A cycle time 144 of 0.5 nanoseconds corresponds to 2.0 gigahertz as the maximum frequency of input signals 12 and 14 that PFD 18 can process. It is understood that if input signals 12 and 14 are out of phase, cycle time 144 will be longer than the example indicated in FIG. 4. However, as long as cycle time 144 is less than or equal to 1 nanosecond, PFD 18 of the present invention operates at frequencies of greater then or equal to 1 gigahertz.

Although the present invention has been described in detail, it should be understood that various changes, alterations, substitutions and modifications may be made to the teachings described herein without departing from the scope and spirit of the present invention which is solely defined by the appended claims.

We claim:

1. A phase/frequency detector circuit, comprising:
a first memory circuit operable to generate a first output signal in response to a first input signal;
a second memory circuit operable to generate a second output signal in response to a second input signal;
each of the first memory circuit and the second memory circuit comprising:
a first cross-coupled transistor pair coupled to a first reference potential, and
a second cross-coupled transistor pair coupled to the first cross-coupled transistor pair and a second reference potential;
a first set circuit coupled to the first memory circuit, the first set circuit operable to transition the first memory circuit to a first state;
a second set circuit coupled to the second memory circuit, the second set circuit operable to transition the second memory circuit to the first state; and
a reset circuit coupled to each of the first memory circuit and the second memory circuit, the reset circuit operable to transition the first memory circuit and the second memory circuit to a second state; and
wherein the first set circuit comprises:
a first set transistor coupled to the first input signal;
an inverter coupled to the first input signal; and
a second set transistor coupled to the output of the inverter, the second set transistor arranged in series with the first set transistor and coupled to the second reference potential.

2. A phase/frequency detector circuit, comprising:
a first memory circuit operable to generate a first output signal in response to a first input signal;
a second memory circuit operable to generate a second output signal in response to a second input signal;
each of the first memory circuit and the second memory circuit comprising:
a first cross-coupled transistor pair coupled to a first reference potential, and
a second cross-coupled transistor pair coupled to the first cross-coupled transistor pair and a second reference potential;
a first set circuit coupled to the first memory circuit, the first set circuit operable to transition the first memory circuit to a first state;
a second set circuit coupled to the second memory circuit, the second set circuit operable to transition the second memory circuit to the first state;
a reset circuit coupled to each of the first memory circuit and the second memory circuit, the reset circuit operable to transition the first memory circuit and the second memory circuit to a second state; and
wherein the reset circuit comprises:
a NOR gate having a first input coupled to the first output signal and a second input coupled to the second output signal, the NOR gate operable to generate a reset signal;
a first reset transistor coupled in parallel to a selected one of the first cross-coupled transistor pair and the second cross-coupled transistor pair of the first memory circuit, the first reset transistor operable to receive the reset signal; and
a second reset transistor coupled in parallel to a selected one of the first cross-coupled transistor pair and the second cross-coupled transistor pair of the second memory circuit, the second reset transistor operable to receive the reset signal.

3. A phase-lock loop circuit comprising:
a phase/frequency detector operable to receive the first input signal and the second input signal, the phase/frequency detector comprising:

a first memory circuit operable to generate a first output signal in response to the first input signal; a second memory circuit operable to generate a second output signal in response to the second input signal; and each of the first memory circuit and the second memory circuit comprising:
 a first cross-coupled transistor pair coupled to a first reference potential, and
 a second cross-coupled transistor pair coupled to the first cross-coupled transistor pair and a second reference potential;

a first set circuit coupled to the first memory circuit, the first set circuit operable to transition the first memory circuit to a first state;

a second set circuit coupled to the second memory circuit, the second set circuit operable to transition the second memory circuit to a first state; and a reset circuit coupled to each of the first memory circuit and the second memory circuit, the reset circuit operable to transition the first memory circuit and the second memory circuit to a second state;

a charge pump coupled to the phase detector and operable to generate a control signal in response to the first and second output signals; and a voltage controlled oscillator coupled to the charge pump and operable to adjust the phase or frequency of the second input signal in response to the control signal; and wherein the first set circuit comprises:
a first set transistor coupled to the first input signal;
an inverter coupled to the first input signal; and
a second set transistor coupled to the output of the inverter, the second set transistor arranged in series with the first set transistor and coupled to the second reference potential.

4. A phase-lock loop circuit comprising:
a phase/frequency detector operable to receive the first input signal and the second input signal, the phase/frequency detector comprising:
 a first memory circuit operable to generate a first output signal in response to the first input signal; a second memory circuit operable to generate a second output signal in response to the second input signal; and
 each of the first memory circuit and the second memory circuit comprising:
  a first cross-coupled transistor pair coupled to a first reference potential, and
  a second cross-coupled transistor pair coupled to the first cross-coupled transistor pair and a second reference potential;
 a first set circuit coupled to the first memory circuit, the first set circuit operable to transition the first memory circuit to a first state;
 a second set circuit coupled to the second memory circuit, the second set circuit operable to transition the second memory circuit to a first state; and
 a reset circuit coupled to each of the first memory circuit and the second memory circuit, the reset circuit operable to transition the first memory circuit and the second memory circuit to a second state;
 a charge pump coupled to the phase detector and operable to generate a control signal in response to the first and second output signals; and
 a voltage controlled oscillator coupled to the charge pump and operable to adjust the phase or frequency of the second input signal in response to the control signal; and
wherein the reset circuit comprises:
 a NOR gate having a first input coupled to the first output signal and a second input coupled to the second output signal, the NOR gate operable to generate a reset signal;
 a first reset transistor coupled in parallel to a selected one of the first cross-coupled transistor pair and the second cross-coupled transistor pair of the first memory circuit, the first reset transistor operable to receive the reset signal; and
 a second reset transistor coupled in parallel to a selected one of the first cross-coupled transistor pair and the second cross-coupled transistor pair of the second memory circuit, the second reset transistor operable to receive the reset signal.

5. A method for detecting the phase or frequency difference between a first input signal and a second input signal, the method comprising:
activating a first SRAM cross-coupled transistor circuit in response to an edge of the first input signal;
activating a second SRAM cross-coupled transistor circuit in response to an edge of the second input signal; and
deactivating the first SRAM cross-coupled transistor circuit and the second SRAM cross-coupled transistor circuit when both the first SRAM cross-coupled transistor circuit and the second SRAM cross-coupled transistor circuit have been activated; and
wherein deactivating the first SRAM cross-coupled transistor circuit comprises:
 generating a reset signal when both the first SRAM cross-coupled transistor circuit and the second SRAM cross-coupled transistor circuit have been activated;
 activating a reset transistor in response to the reset signal; and
 activating a third transistor associated with a first cross-coupled transistor pair and a fourth transistor associated with a second cross-coupled transistor pair in response to the activation of the reset transistor.

* * * * *